United States Patent [19]
Wang et al.

[11] Patent Number: 5,961,725
[45] Date of Patent: Oct. 5, 1999

[54] CONICAL BAFFLE FOR SEMICONDUCTOR FURNACES

[75] Inventors: Ying-Lang Wang, Tai-chung; Yu-Jen Yu, Hsin-chu, both of Taiwan

[73] Assignee: Taiwan Semiconductor Manufacturing Company, Ltd., Hsin-chu, Taiwan

[21] Appl. No.: 09/093,030

[22] Filed: Jun. 8, 1998

Related U.S. Application Data

[62] Division of application No. 08/954,833, Oct. 21, 1997, Pat. No. 5,792,701.

[51] Int. Cl.$^6$ .................................................. C23C 16/00
[52] U.S. Cl. ................................................................ 118/715
[58] Field of Search .............................. 422/228; 118/715

[56] References Cited

U.S. PATENT DOCUMENTS

| | | |
|---|---|---|
| 4,081,313 | 3/1978 | McNeilly et al. ....................... 156/610 |
| 4,699,805 | 10/1987 | Seelbach et al. ........................ 437/245 |
| 4,822,574 | 4/1989 | Touborg ................................. 422/228 |
| 4,835,114 | 5/1989 | Satou et al. ............................... 437/81 |
| 5,020,476 | 6/1991 | Bay et al. ............................... 118/728 |
| 5,037,775 | 8/1991 | Reisman ................................... 437/89 |
| 5,244,831 | 9/1993 | Hindeman et al. ..................... 437/164 |
| 5,651,944 | 7/1997 | Schulz et al. ........................... 422/137 |
| 5,792,701 | 8/1998 | Wang et al. ............................ 438/565 |

*Primary Examiner*—Bruce Breneman
*Assistant Examiner*—Alva C Powell
*Attorney, Agent, or Firm*—George O. Saile; Stephen B. Ackerman; William J. Stoffel

[57] ABSTRACT

An apparatus for producing thin film coatings and/or dopant levels on semiconductor wafers or other substrates with improved film growth uniformity (of thickness and composition) and/or dopant uniformity is provided. The apparatus is positioned in a furnace tube between the wafers and a gas inlet. The apparatus comprises a conical shaped baffle.

12 Claims, 2 Drawing Sheets

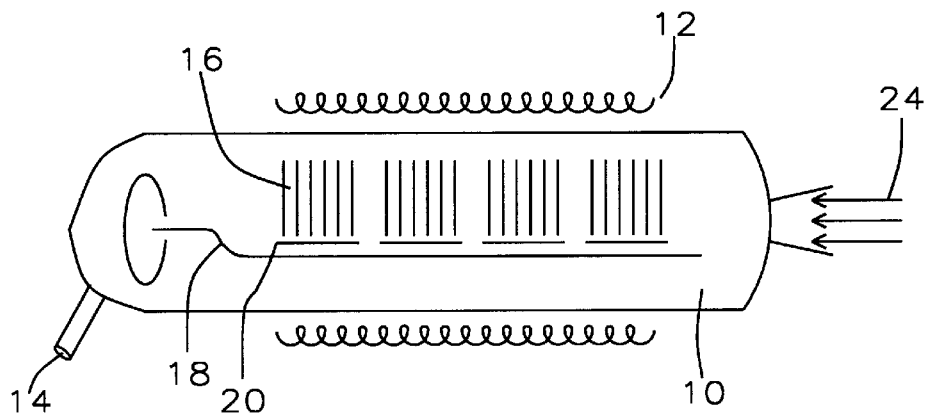
FIG. 1 - Prior Art
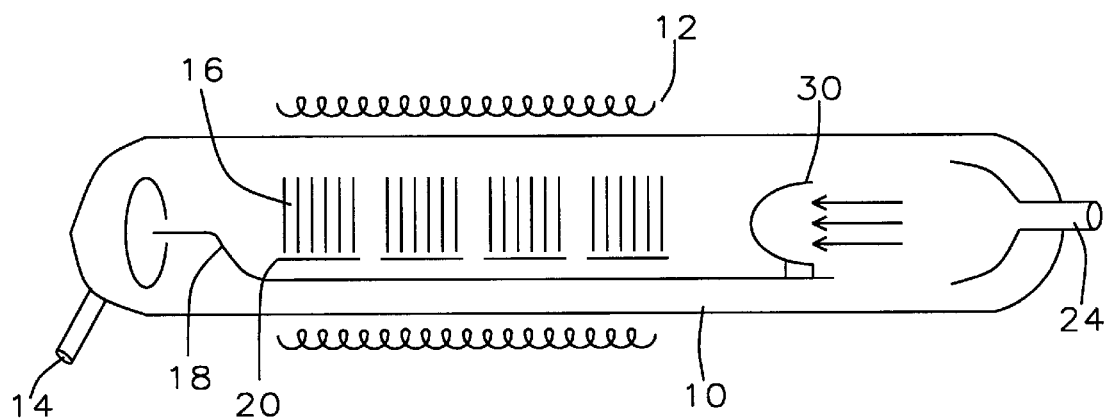
FIG. 2

CONICAL BAFFLE FOR SEMICONDUCTOR FURNACES

This is a division of patent application Ser. No. 08/954,833, filing date Oct. 21, 1997, A Conical Baffle For Semiconductor Furnaces, now U.S. Pat. No. 5,792,701, assigned to the same assignee as the present invention.

BACKGROUND OF INVENTION

1) Field of the Invention

Semiconductor oxidation and diffusion processing and low pressure CVD of silicon dioxide (doped and undoped), silicon (doped and undoped), single -and poly-crystalline, silicon, silicon nitride, and other thin films (conductive, semi-conductive, and insulating) on semiconductor wafer substrates. Low pressure chemical vapor deposition of silicon dioxide (doped and undoped), polysilicon (doped and undoped), silicon nitride, and other thin films (conductive, semi-conductive, and insulating) or larger for display panel substrates.

2) Description of the Prior Art

In semiconductor integrate circuit manufacturing, phosphorus-doped oxides are used to dope underlying silicon layers. These doped silicon layers are used to form semiconductor devices. In order to increase yields of these semiconductor devices, the doped layers must have the maximum uniformity achievable.

One method of forming phosphorus doped oxides (also called P-glass, phosphosilicate glass, and PSG) is by deposition in a hot walled furnace. As shown in FIG. 1, wafers 16 are placed on a sled 20. The sleds 20 typically sit on a carrier 18 which is used to insert and remove the sleds 20 from the furnace tube 10. Reactant gasses enter the furnace at the source end 24 of the furnace tube and are exhausted on the other end through an exhaust 14.

One process for forming phosphorus doped oxide is:

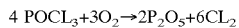

$$4\ POCL_3 + 3O_2 \rightarrow 2P_2O_5 + 6CL_2$$

The reactant gasses ($POCL_3 + O_2$) flow into the tube 10 at the source end 24 pass the wafers on which the phosphosilicate glass (PSG) is formed.

When attempting to diffuse a large number of wafers at the same time with phosphorous and particularly wafers of a substantially large diameter, there must be substantially uniform diffusion of the phosphorous into each of the wafers to obtain the desired resistivity of the doped layer. Thus, if the wafers that are farthest from the source end (gas inlet end) do not receive substantially the same diffusion of phosphorous as the wafers closest to the source end there will be a very substantial difference in both the thickness of the doped glass and the concentration of the phosphorous in the wafers so as to lower the yield of the wafers.

Deposition reactions are complicated and depend on many factors such as furnace temperature, gas flow rates, wafer spacings, etc. One major factor in uniformly doping wafers, the reactant gasses must be well mixed and turbulent. This mixing will ensure that the reactants will uniformly dope within the wafers from edge to center, top to bottom and from wafer to wafer (front to back of the carrier).

One method of increasing phosphorus doping uniformity is to increase the spacing between the wafers to improve the gas flow between the wafers. However, increasing the spacing decreases the wafer throughput thus increasing manufacturing costs. Another method of increasing the uniformity is to place dummy wafers in front of product wafers in a carrier. While this improves the film uniformity, more uniformity is still required. Moreover, the dummy wafers take up space where product wafers could be thus reducing wafer throughput and increasing costs.

Therefore, It is desirable to have a device or method of improving the deposition uniformity (e.g., thickness and resistivity) of closely spaced wafers without decreasing throughput and increasing costs.

SUMMARY OF THE INVENTION

It is an object of the present invention to provide an apparatus which improves the uniformity of doped layers in wafers formed by deposition in furnaces, and more particularly improves the uniformity of phosphorus doped layers.

It is another object of the present invention to provide an apparatus which improves the uniformity of phosphorus doped layers in wafers formed by deposition in furnaces and to improve the Rs uniformity of phosphorus doped wafers.

It is yet another object of the present invention to provide an apparatus which improves the thickness and/or resistivity uniformity of layers on wafers formed by deposition/oxidations in furnaces.

In accordance with the above objectives, an apparatus and method for producing thin film coatings and/or dopant levels on or in semiconductor wafers or other substrates with improved film growth uniformity (of thickness and composition) and/or dopant uniformity is provided. The apparatus is positioned in a furnace tube between the wafers and a gas inlet. The apparatus comprises a conical shaped baffle. The conical shaped baffle provides superior gas mixing properties compared to other shaped baffles including dummy wafers. Moreover, the baffle can be scaled for any size wafer and furnace.

The baffle of the present invention can be used in a method of fabricating wafers with an improved uniformity of phosphorus doping. The method comprises placing the conical shaped baffle between a reactant gases inlet and a sled of wafers in a furnace. Next, reactant gases containing phosphorus are flowed at a selected flow rate through the gas inlet around the conical shaped baffle, pass the wafers and out an outlet. The furnace is maintained at a selected temperature, thereby uniformly doping the wafers.

The baffle of the present invention improves layer thickness and doping uniformity by providing more complete mixing of reactant gases. Moreover, the number of wafers per furnace run can be substantially increased while maintaining or increasing uniformity. The baffle increases process capabilities, improves device yields, and can allow the batch run sizes to increase which reduces manufacturing costs.

BRIEF DESCRIPTION OF THE DRAWINGS

The drawings show the following:

FIG. 1 is a drawing showing a furnace and wafers of the prior art.

FIG. 2 is a drawing showing furnace with the conical baffle of present invention.

DETAILED DESCRIPTION OF THE PREFERRED EMBODIMENTS

Figure 3:
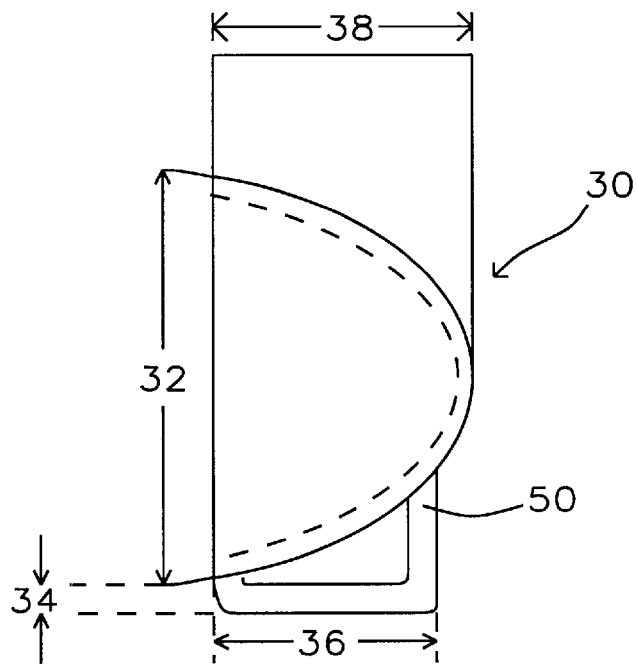
FIG. 3 is a cross-sectional view of an embodiment of the baffle of the present invention.

According to the present process, as shown in FIG. 2, an apparatus for producing thin film coatings and/or dopant levels on or in semiconductor wafers or other substrates with improved film growth uniformity (of thickness and composition) and/or dopant uniformity is provided. FIG. 2 shows a furnace 10 with heating coils 12. Wafers 16 are placed on a sled 20. The sleds typically side on a carrier 18 which is used to insert and remove the sleds 20 from the furnace tube 10. Reactant gasses enter the furnace 10 at the source end 24 of the furnace tube 10 and are exhausted on the other end through an exhaust outlet 14.

The apparatus 30 of the current invention is positioned in a furnace tube between the wafers 16 and the gas inlet 24. The baffle 30 is preferably mounted on a carrier 18. The apparatus comprises a conical shaped baffle 30 as shown is FIGS. 2, 3, and 4. The apparatus 30 can be described as a hollow conical shaped baffle having an annular open front end and a closed back tip. The annular open front end faces the inlet 24 of the furnace 10. See FIG. 2. The conical shape refers to the cone or parabolic cross sectional shape of the baffle. Hollow refers to the cavity formed by the open front end of the conical (or parabolic cross section) shaped baffle. The baffle can be composed of any material that can withstand the process temperatures and the reactant gasses and if preferably formed of a quartz material or a silicon carbide material. The baffle 30 can be scaled for use with different diameter wafers and furnace tubes. As shown in FIG. 3, the conical portion of the baffle 30 is made of one piece of material and that the one piece of material has two sides (i.e., the annular open front end side and the closed back end tip side )

Figure 4:
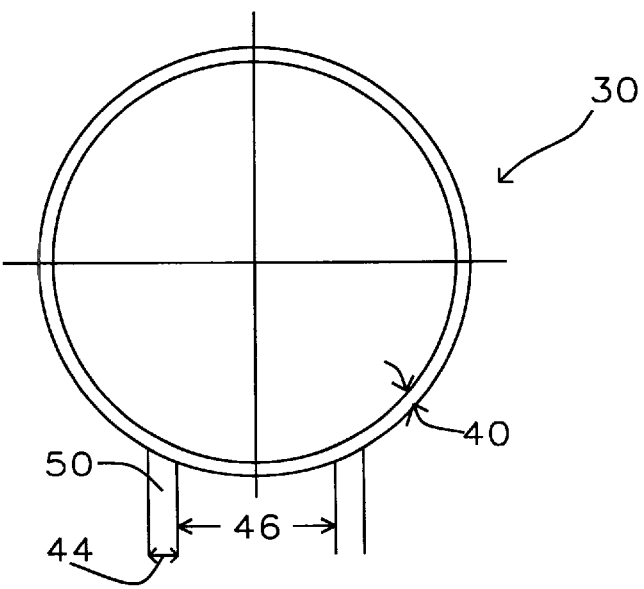
FIG. 4 is a front view of an embodiment of the baffle of the present invention.

Referring to FIGS. 3 and 4, when used with approximately 6 inch diameter wafers, the baffle 30 can have a diameter 32 in the range of about 154 to 166 mm. Moreover, the baffle 30 can have a length 38 in the range of about 89 to 99 mm. The baffle can have a thickness 40 in the range of about 2 to 4 mm and more preferable a thickness 40 of about 3 mm.

When used with approximately 8 inch diameter wafers, the baffle 30 can preferably have a diameter 32 in the range of about 204 to 216 mm. and a length 38 in the range of about 89 to 99 mm. The baffle can preferably have a thickness 40 in the range of about 2 to 4 mm and more preferable a thickness 40 of about 3 mm.

The baffle can further include a mounting base. The mounting base can be formed in many configurations and preferably can comprise two rails 50 as shown in FIGS. 3 and 4.

For a baffle designed for use with approximately 6 inch wafers, the length 36 of the rails can be in the range of about 75 to 85 mm and more preferably a length of about 80 mm. The rails can have a diameter 44 of about 7 to 13 mm and more preferably a diameter of about 10 mm. The spacing 46 between the rails can be in the range of about 47 to 53 mm and more preferably about 50 mm. The rails 50 can have a height in the front 34 of the baffle (i.e., the side facing the gas inlet) of between about 8 to 12 mm and more preferably about 10 mm.

For a baffle designed for use with approximately 8 inch wafers, the length 36 of the rails can be in the range of about 95 to 105 mm and more preferably a length of about 100 mm. The rails can have a diameter 44 of about 7 to 13 mm and more preferably a diameter of about 10 mm. The spacing 46 between the rails can be in the range of about 47 to 53 mm and more preferably about 50 mm. The rails 50 can have a height in the front 34 of between about 8 to 12 mm and more preferably about 10 mm.

The baffle can be used in any furnace process, including vertical and horizontal furnaces, where reactant gasses are passed over wafers. For example, the baffle can be used for semiconductor chemical vapor deposition (CVD) and diffusion/oxidation processes, such as $POCL_3$ diffusion processes, silicon oxidations, and low pressure silicon nitride chemical vapor deposition processes.

The baffle of the present invention can be used in a process for forming uniform layers of $P_2O_5$ and uniform doping level in wafers. The method comprises placing the conical shaped baffle 30 of the present invention between a reactant gases inlet 24 and a sled of wafers 16 in a furnace 10 as shown in FIG. 2. Next, reactant gases containing phosphorus are flowed at a selected flow rate through the gas inlet 24 around the conical shaped baffle 30, pass the wafers 16, and out an outlet 14. The reactant gasses flow rate can be of the following gasses: oxygen at approximately 500 sccm, $POCl_3$ at approximately 1000 sccm and Nitrogen at approximately 12,000 sccm. The furnace can be maintained at a selected temperature for doping the wafers. The selected temperature of the furnace can be in the range of about 875 to 1000° C. and more preferably approximately 970 C. The baffle is positioned a distance between about 10 to 30 cm in front of the wafers 16 and a distance of between about 10 to 40 cm. behind the gas inlet 24.

The baffle of the present invention insures that there is turbulent flow of reactant gasses into each of the wafers. The baffle of the present invention improves layer thickness and doping uniformity by providing complete mixing of reactant gases. The conical shape of the baffle increases the reactant gas uniformity by increasing the mixing time and causing a more turbulent gas mixing pattern. Moreover, because of the increase uniformity, the number of wafers per furnace run can be substantially increased while maintaining or increasing uniformity (e.g., thickness and/or resistivity). The baffle increases process capabilities, improves device yields, increases batch run sizes and reduces manufacturing costs.

While the invention has been particularly shown and described with reference to the preferred embodiments thereof, it will be understood by those skilled in the art that various changes in form and details may be made without departing from the spirit and scope of the invention.

What is claimed is:

1. An apparatus for producing thin film coatings and/or dopant levels on or in semiconductor wafers or other substrates with improved film growth uniformity of thickness and composition, and/or dopant uniformity; the apparatus positioned in a furnace tube between the wafers and a gas inlet, the apparatus comprising a conical shaped baffle; said conical shaped baffle having an annular open front end and a closed back tip.

2. The apparatus of claim 1 wherein said baffle is made of quartz.

3. The apparatus of claim 1 wherein said baffle is made of silicon carbide.

4. The apparatus of claim 1 wherein said baffle has a diameter in the range of about 154 to 166 mm. and a length in the range of about 89 to 99 mm.

5. The apparatus of claim 1 wherein said baffle further includes a mounting base.

6. The apparatus of claim 5 where the mounting base comprises two rails.

7. The apparatus of claim 1 wherein said baffle has a diameter in the range of 204 to 216 mm. and a length in the range of about 89 to 99 mm.

8. The apparatus of claim 1 wherein said baffle is used for semiconductor diffusion/oxidation processes.

9. The apparatus of claim 1 said baffle is used for in a semiconductor fabrication processes for forming a material selected from the group consisting of:

phosphorus doped oxide, silicon oxide and silicon nitride.

10. The apparatus of claim 1 said baffle is mounted onto a carrier.

11. An apparatus for producing thin film coatings and/or dopant levels on or in semiconductor wafers or other substrates with improved film growth uniformity of thickness and composition, and/or dopant uniformity; the apparatus positioned in a furnace tube between the wafers and a gas inlet, the apparatus comprising a conical shaped baffle; said baffle has a diameter in the range of about 154 to 166 mm. and a length in the range of about 89 to 99 mm.

12. An apparatus for producing thin film coatings and/or dopant levels on or in semiconductor wafers or other substrates with improved film growth uniformity of thickness and composition, and/or dopant uniformity; the apparatus positioned in a furnace tube between the wafers and a gas inlet, the apparatus comprising a conical shaped baffle; said baffle has a diameter in the range of 204 to 216 mm. and a length in the range of about 89 to 99 mm.

* * * * *